(12) United States Patent
Zhang et al.

(10) Patent No.: US 12,114,425 B2
(45) Date of Patent: Oct. 8, 2024

(54) CABLE ASSEMBLY, SIGNAL TRANSMISSION STRUCTURE, AND ELECTRONIC DEVICE

(71) Applicant: Huawei Technologies Co., Ltd., Shenzhen (CN)

(72) Inventors: Guodong Zhang, Dongguan (CN); Chong Chen, Dongguan (CN); Jian Zhang, Dongguan (CN); Shaoyong Xiang, Dongguan (CN); Zhijun Qu, Dongguan (CN); Changxing Sun, Nanjing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 129 days.

(21) Appl. No.: 17/942,442

(22) Filed: Sep. 12, 2022

(65) Prior Publication Data

US 2023/0007773 A1 Jan. 5, 2023

Related U.S. Application Data (63) Continuation of application No. PCT/CN2021/072568, filed on Jan. 18, 2021.

(30) Foreign Application Priority Data

Mar. 13, 2020 (CN) .......................... 202010178016.7

(51) Int. Cl.
*H05K 1/00* (2006.01)
*H05K 1/11* (2006.01)
*H05K 1/18* (2006.01)

(52) U.S. Cl.
CPC ............. *H05K 1/116* (2013.01); *H05K 1/184* (2013.01); *H05K 2201/09509* (2013.01); *H05K 2201/10901* (2013.01)

(58) Field of Classification Search
CPC ................... H05K 1/116; H05K 1/184; H05K 2201/09509; H05K 2201/10901
See application file for complete search history.

(56) References Cited

U.S. PATENT DOCUMENTS

| | | | |
|---|---|---|---|
| 2004/0094328 A1 | 5/2004 | Fjelstad et al. |
| 2009/0225526 A1 | 9/2009 | Behziz |
| 2014/0268577 A1 | 9/2014 | Swaminathan et al. |
| 2014/0349496 A1 | 11/2014 | Zhu et al. |
| 2014/0361802 A1 | 12/2014 | Chen et al. |
| 2015/0130491 A1 | 5/2015 | Kretz |
| 2016/0172289 A1 | 6/2016 | Kung et al. |

(Continued)

FOREIGN PATENT DOCUMENTS

| | | |
|---|---|---|
| CN | 104183986 A | 12/2014 |
| CN | 104299951 A | 1/2015 |

(Continued)

*Primary Examiner* — Pete T Lee
(74) *Attorney, Agent, or Firm* — Conley Rose, P.C.

(57) ABSTRACT

A signal transmission structure includes a circuit board, a chip, and a cable assembly. The chip is assembled on one side of the circuit board, and the cable assembly is assembled on the other side of the circuit board. The cable assembly includes a cable, and the circuit board includes a plurality of conductive holes. The chip is electrically connected to the cable of the cable assembly using the conductive hole to transmit a signal of the chip using the cable.

20 Claims, 7 Drawing Sheets

(56) References Cited

U.S. PATENT DOCUMENTS

| | | | |
|---|---|---|---|
| 2016/0174373 A1* | 6/2016 | Lee | H05K 1/147 |
| | | | 174/262 |
| 2016/0365684 A1* | 12/2016 | Li | H05K 1/116 |
| 2017/0311435 A1* | 10/2017 | Ohsawa | H05K 1/184 |
| 2018/0006416 A1 | 1/2018 | Lloyd et al. | |
| 2018/0034175 A1 | 2/2018 | Lloyd et al. | |
| 2018/0102264 A1 | 4/2018 | Landru et al. | |
| 2018/0120906 A1 | 5/2018 | Reed et al. | |
| 2019/0287892 A1* | 9/2019 | Sääski | H01L 23/50 |
| 2019/0380210 A1* | 12/2019 | Lin | H05K 3/4617 |
| 2020/0185842 A1* | 6/2020 | Lloyd | H01L 23/3672 |

FOREIGN PATENT DOCUMENTS

| | | |
|---|---|---|
| CN | 104409440 A | 3/2015 |
| CN | 104569782 A | 4/2015 |
| CN | 107112666 A | 8/2017 |
| CN | 107113994 A | 8/2017 |
| CN | 107548480 A | 1/2018 |
| CN | 107732480 A | 2/2018 |
| CN | 110337182 A | 10/2019 |
| FR | 3057391 A1 | 4/2018 |
| JP | S5137177 U | 3/1976 |
| JP | 2001352004 A | 12/2001 |
| JP | 2002214285 A | 7/2002 |
| JP | 2012114044 A | 6/2012 |
| JP | 2015523743 A | 8/2015 |
| WO | 2017127513 A1 | 7/2017 |
| WO | 2019055911 A1 | 3/2019 |

* cited by examiner

CABLE ASSEMBLY, SIGNAL TRANSMISSION STRUCTURE, AND ELECTRONIC DEVICE

CROSS-REFERENCE TO RELATED APPLICATIONS

This is a continuation of International Patent Application No. PCT/CN2021/072568 filed on Jan. 18, 2021, which claims priority to Chinese Patent Application No. 202010178016.7 filed on Mar. 13, 2020. The disclosures of the aforementioned applications are hereby incorporated by reference in their entireties.

TECHNICAL FIELD

This disclosure relates to the field of information technologies, and in particular, to a cable assembly, a signal transmission structure, and an electronic device.

BACKGROUND

Figure 1:
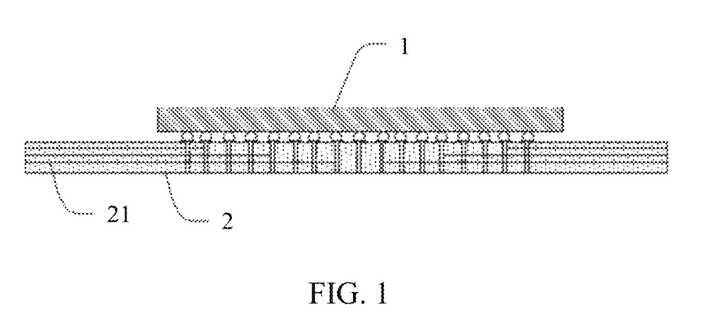
FIG. 1 is a schematic diagram of a structure of a signal transmission structure.

As a communications system requires an increasingly high signal transmission rate, limitations of a conventional signal transmission solution become more prominent, and a new architecture needs to be designed to match a requirement of a high transmission rate. A conventional signal transmission structure usually includes a printed circuit board (PCB) and a chip element and a connector that are installed on the circuit board. In a technical solution, as a core part, a chip is welded on a surface of the circuit board by using a ball grid array (BGA). FIG. 1 is a schematic diagram of a structure of a signal transmission structure. As shown in FIG. 1, a signal inside the chip 1 is transmitted to a circuit board 2 by using a solder ball, and then is connected to elements such as another chip or a connector by using a wire 21 inside the circuit board, to implement signal transmission. In this solution, the chip 1 is connected to a connector by using the wire 21 inside the circuit board, and connectors are further connected to each other, to implement signal transmission between different chips.

In the conventional technology, wiring needs to be performed inside the circuit board, which imposes a relatively high requirement for a level of the circuit board, and consequently costs of a product are relatively high. In addition, a loss in signal transmission through the wire inside the circuit board is large, which seriously restricts an increase in a signal transmission rate. Therefore, a new signal transmission solution needs to be proposed.

SUMMARY

This disclosure provides a cable assembly, a signal transmission structure, and an electronic device, to increase a transmission rate of a signal transmission structure and reduce costs of the signal transmission structure.

According to a first aspect, this disclosure provides a signal transmission structure. The signal transmission structure includes a circuit board, a chip, and a cable assembly, the chip is assembled on one side of the circuit board, and the cable assembly is assembled on the other side of the circuit board. The cable assembly includes a cable, and the circuit board includes a plurality of conductive holes. The chip is electrically connected to the cable of the cable assembly by using the conductive hole, to transmit a signal of the chip by using the cable. In this technical solution, wires do not need to be disposed in a large area inside the circuit board, so that a requirement for a loss-resistance property of a PCB board material is relatively low, that is, a requirement for a level of the PCB board material may be reduced, thereby reducing material costs. In addition, a signal transmission rate of the cable is much higher than a signal transmission rate of the wire inside the circuit board, which further facilitates long-distance signal transmission. Therefore, in this solution, not only costs of a product are reduced, but also an application range of a communications device is extended and high-speed performance of the product is improved.

To electrically connect the chip and the cable, the circuit board further includes a first pad and a second pad. The first pad is electrically connected to the chip, and the second pad is electrically connected to the cable. Two ends of the conductive hole are respectively electrically connected to the first pad and the second pad, to electrically connect the chip and the cable. Further, the first pad and the second pad may be connected in a plurality of manners. For example, the first pad and the second pad may be directly connected at the two ends of the conductive hole. Alternatively, a relatively short wire inside the circuit board is used to connect the first pad to one end of the conductive hole, the other end of the conductive hole is connected to the wire inside the circuit board, and the wire inside the circuit board is connected to the second pad, so as to form a conductive path to electrically connect the first pad and the second pad. In another technical solution, the first pad may be connected to a wire inside the circuit board, the wire inside the circuit board is connected to one end of the conductive hole, and the other end of the conductive hole is connected to the second pad, so as to form a conductive path to electrically connect the first pad and the second pad.

The cable assembly includes a base and a plurality of cable units installed on the base. The cable unit includes a cable and a grounding part. The grounding part is configured to be grounded. The cable may be configured to transmit a differential signal, and the grounding part may provide a reference voltage for the differential signal of the cable. A surface of the base has a conductive part that is grounded. A quantity of conductive parts is not limited, and there may be one or more conductive parts. The grounding part of the cable unit is electrically connected to the conductive part of the base, to ground the grounding part. Further, the grounding part is electrically connected to the conductive part. In this solution, the grounding part is configured to provide the reference voltage for the differential signal, which helps simplify a structure of the cable assembly and improve arrangement density of the cable units on the base of the cable assembly. The chip further includes a ground pin. The ground pin is electrically connected to the conductive part of the base by using the conductive hole, so that a ground network may be formed to shield a crosstalk signal of the chip. In this solution, the cable and the circuit board may be relatively fastened by using the base. Further, a manner of fastening the base and the circuit board is not limited, for example, the base and the circuit board may be fastened through threaded connection, bonding, welding, crimping, or riveting.

A specific form and structure of the conductive part of the base are not limited. For example, the base may be a metal base, and the base has conductivity. In this case, it may be considered that the conductive part is at least a part of a region of the base. Alternatively, the base may be an insulation base manufactured by using an insulation material, and the conductive part may be fastened on a surface of the insulation base, to be used as a grounding structure. It should be noted that when the base is insulated, the conductive part may be located on the surface of the base or another conductor inside the base is electrically connected to the grounding part.

A specific structure of the conductive part fastened on the surface of the base is also not limited. For example, a metal plate may be fastened on the surface of the base, and the metal plate may be used as the conductive part. The metal plate may further include a compressible contact, such as a stamping bump or a cut elastic pin. The metal plate may be electrically connected to the conductive hole of the circuit board by using the compressible contact, to be electrically connected to the ground pin of the chip. In this solution, a structure of the conductive part of the base is relatively simple and has the compressible contact that may be directly electrically connected to the conductive hole of the circuit board, so that a connection structure is also relatively simple.

Another type of conductive part may be a conductive adhesive, a conductive foam, or the like, and is bonded to the surface of the base. The conductive part is elastic, so that when the base and the circuit board are fixedly installed, the conductive part may be directly electrically connected to the conductive hole, and a structure is relatively simple.

The cable unit further includes a cable and a signal connection terminal, and the cable includes a signal wire connected to the signal connection terminal in a one-to-one correspondence manner. The chip includes a signal pin, and the signal pin is electrically connected to the signal connection terminal by using the conductive hole, to electrically connect the chip and the cable, so as to transmit a signal of the chip by using the cable.

It should be noted that the cable includes at least two signal wires, or the cable may include one or more pair of signal wires.

To implement reliable connection between the cable and the signal connection terminal, the cable unit further includes a cable fastening head. The cable fastening head is at a location at which the signal wire is connected to the signal connection terminal, and the cable fastening head is installed on a substrate, so that the cable unit can be installed on the substrate. Further, the cable fastening head may be disposed perpendicularly to the base, or the cable fastening head may be disposed to form a specified angle with the base, that is, the cable fastening head is disposed inclined to the base.

The cable fastening head may be further used as another conductor to connect the grounding part of the cable assembly to the conductive part of the base. Further, the cable fastening head may have a conductive structure, and the conductive structure is electrically connected to the conductive part of the base. Further, when the cable fastening head is installed on the base, the conductive structure of the cable fastening head is in contact with the base. When the base is a metal base, the base may be connected to the conductive part by using conductivity of the base. Alternatively, when the base is an insulation base, a conductive layer may be coated on an inner wall of an opening at which the cable fastening head is installed on the base, the conductive layer is in contact with and electrically connected to the conductive structure of the cable fastening head, and then the conductive layer is electrically connected to the conductive part of the base.

In a specific technical solution, a specific structure of the grounding part is also not limited. Optionally, the cable may further include a grounding wire disposed in parallel with the signal wire, and the grounding wire may be used as the grounding part. The grounding wire does not need to protrude from the cable fastening head and can be directly electrically connected to the cable fastening head to be electrically connected to the conductive part of the base. Alternatively, the cable further includes a wrapping layer wrapped outside the signal wire. The wrapping layer includes a shielding layer electrically connected to the cable fastening head, and the shielding layer is electrically connected to the cable fastening head to be electrically connected to the conductive part of the base. In this solution, the grounding part of the cable is electrically connected to the base by using the cable fastening head, and the cable unit does not need to protrude from a fastening head of the base, which helps reduce space occupied by the cable unit on the base, thereby improving arrangement density of the cable units on the base.

Further, because the cable unit is electrically connected to the signal pin of the chip by using the conductive hole, the arrangement density of the cable units on base matches arrangement density of signal pins of the chip. In this case, the arrangement density of the cable arrangement units on the base is relatively high. The "matching" may be the same or may be slightly different.

In a specific embodiment, the cable assembly may further include a ground connection terminal electrically connected to the conductive part of the base, and the ground connection terminal is electrically connected to the ground pin of the chip by using a through-hole of the circuit board. The signal connection terminal and the ground connection terminal of the cable assembly each may be an elastic pin, a spring pin, a solder ball, or a crimping pin. A user may select an appropriate terminal form based on a requirement.

According to a second aspect, this disclosure further provides an electronic device. The electronic device includes the signal transmission structure in any of the foregoing technical solutions. In this technical solution, wires do not need to be disposed in a large area inside the circuit board in the signal transmission structure, so that a requirement for a loss-resistance property of a PCB board material is relatively low, that is, a requirement for a level of the PCB board material may be reduced, thereby reducing material costs. In addition, a signal transmission rate of the cable is much higher than a signal transmission rate of the wire inside the circuit board, which further facilitates long-distance signal transmission. Therefore, in this solution, not only costs of a product are reduced, but also an application range of the electronic device is extended and high-speed performance of the product is improved.

According to a third aspect, this disclosure further provides a cable assembly. The cable assembly includes a base and a plurality of cable units installed on the base. The cable unit includes a cable and a grounding part. The grounding part is configured to be grounded. The cable may be configured to transmit a differential signal, and the grounding part may provide a reference voltage for the differential signal of the cable. A surface of the base has a conductive part that is grounded. A quantity of conductive parts is not limited, and there may be one or more conductive parts. The grounding part of the cable unit is electrically connected to the conductive part of the base, to ground the grounding part. Further, the grounding part is electrically connected to the conductive part. In this solution, the grounding part is configured to provide the reference voltage for the differential signal, which helps simplify a structure of the cable assembly and improve arrangement density of the cable units on the base of the cable assembly.

A specific form and structure of the conductive part of the base are not limited. For example, the base may be a metal base, and the base has conductivity. In this case, it may be considered that the conductive part is at least a part of a region of the base. Alternatively, the base may be an insulation base manufactured by using an insulation material, and the conductive part may be fastened on a surface of the insulation base, to be used as a grounding structure. It should be noted that when the base is insulated, the conductive part may be located on the surface of the base or another conductor inside the base is electrically connected to the grounding part.

A specific structure of the conductive part fastened on the surface of the base is also not limited. For example, a metal plate may be fastened on the surface of the base, and the metal plate may be used as the conductive part. The metal plate may further include a compressible contact, such as a stamping bump or a cut elastic pin. The metal plate may be electrically connected to the conductive hole of the circuit board by using the compressible contact, to be electrically connected to the ground pin of the chip. In this solution, a structure of the conductive part of the base is relatively simple and has the compressible contact that may be directly electrically connected to the conductive hole of the circuit board, so that a connection structure is also relatively simple.

Another type of conductive part may be a conductive adhesive, a conductive foam, or the like, and is bonded to the surface of the base. The conductive part is elastic, so that when the base and the circuit board are fixedly installed, the conductive part may be directly electrically connected to the conductive hole, and a structure is relatively simple.

The cable unit further includes a cable and a signal connection terminal, and the cable includes a signal wire connected to the signal connection terminal in a one-to-one correspondence manner. The chip includes a signal pin, and the signal pin is electrically connected to the signal connection terminal by using the conductive hole, to electrically connect the chip and the cable, so as to transmit a signal of the chip by using the cable. Further, because the cable unit is electrically connected to the signal pin of the chip by using the conductive hole, the arrangement density of the cable units on base matches arrangement density of signal pins of the chip. In this case, the arrangement density of the cable arrangement units on the base is relatively high.

To implement reliable connection between the cable and the signal connection terminal, the cable unit further includes a cable fastening head. The cable fastening head is at a location at which the signal wire is connected to the signal connection terminal, and the cable fastening head is installed on a substrate, so that the cable unit can be installed on the substrate. Further, the cable fastening head may be disposed perpendicularly to the base, or the cable fastening head may be disposed to form a specified angle with the base, that is, the cable fastening head is disposed inclined to the base.

The cable fastening head may be further used as another conductor to connect the grounding part of the cable assembly to the conductive part of the base. Further, the cable fastening head may have a conductive structure, and the conductive structure is electrically connected to the conductive part of the base. Further, when the cable fastening head is installed on the base, the conductive structure of the cable fastening head is in contact with the base. When the base is a metal base, the base may be connected to the conductive part by using conductivity of the base. Alternatively, when the base is an insulation base, a conductive layer may be coated on an inner wall of an opening at which the cable fastening head is installed on the base, the conductive layer is in contact with and electrically connected to the conductive structure of the cable fastening head, and then the conductive layer is electrically connected to the conductive part of the base.

In a specific technical solution, a specific structure of the grounding part is also not limited. Optionally, the cable may further include a grounding wire disposed in parallel with the signal wire, and the grounding wire may be used as the grounding part. The grounding wire does not need to protrude from the cable fastening head and can be directly electrically connected to the cable fastening head to be electrically connected to the conductive part of the base. Alternatively, the cable further includes a wrapping layer wrapped outside the signal wire. The wrapping layer includes a shielding layer electrically connected to the cable fastening head, and the shielding layer is electrically connected to the cable fastening head to be electrically connected to the conductive part of the base. In this solution, the grounding part of the cable is electrically connected to the base by using the cable fastening head, and the cable unit does not need to protrude from a fastening head of the base, which helps reduce space occupied by the cable unit on the base, thereby improving arrangement density of the cable units on the base.

In a specific embodiment, the cable assembly may further include a ground connection terminal electrically connected to the conductive part of the base, and the ground connection terminal is electrically connected to the ground pin of the chip by using a through-hole of the circuit board. The signal connection terminal and the ground connection terminal of the cable assembly each may be an elastic pin, a spring pin, a solder ball, or a crimping pin. A user may select an appropriate terminal form based on a requirement.

Further, the base may be a plate-shaped base, may be an integral structure, or may include at least two splicing parts. Therefore, when a cable assembly with a relatively large size is manufactured, a part corresponding to each splicing part may be first manufactured, to facilitate manufacturing, storage, and transportation.

Reference numerals: 1—chip; 11—pin; 111—signal pin; 112—ground pin; 12—chip body; 13—installation base; 14—elastic pin; 2—circuit board; 21—wire inside the circuit board; 22—conductive hole; 23—first pad; 24—second pad; 25—wire; 3—cable assembly; 31—cable; 311—signal wire; 312—grounding wire; 32—base; 321—splicing part; 322—fastening part; 33—connection terminal; 331—signal connection terminal; 332—ground connection terminal; 34—cable unit; 341—cable fastening head; 342—wrapping layer; 4—heat dissipation component; 5—metal plate; 51—compressible contact; 52—opening; 6—conductive part; and 7—connector.

DESCRIPTION OF EMBODIMENTS

To make the objectives, technical solutions, and advantages of this disclosure clearer, the following further describes this disclosure in detail with reference to the accompanying drawings.

The terms used in the following embodiments are merely intended to describe specific embodiments and are not intended to limit this disclosure. As used in the specification and the appended claims of this disclosure, singular expressions such as "one", "one type", "the", "the foregoing", and "this" are intended to include the expression "one or more", unless an explicit contrary indication is expressly in their context.

Reference to "one embodiment", "some embodiments", or the like described in the specification means that specific features, structures, or features described with reference to the embodiment are included in one or more embodiments of this disclosure. Therefore, the statements "in one embodiment", "in some embodiments", "in some other embodiments", "in some other embodiments", and the like that appear in different parts of the specification unnecessarily mean reference to a same embodiment, but mean "one or more embodiments but not all embodiments" unless otherwise emphasized in another manner. The terms "include", "comprise", "have", and variations thereof all mean "include but not limited to" unless otherwise emphasized in another manner.

The signal transmission structure provided in the embodiments of this disclosure may be applied to any electronic device that needs to transmit a signal. In the conventional technology, a chip is installed on a circuit board, and signal transmission between the chip and another structure usually needs to be implemented by using a wire located inside the circuit board. Wiring is performed inside the circuit board, which imposes a relatively high requirement for a level of the circuit board, and consequently costs of a product are relatively high. In addition, signal transmission efficiency of the wire inside the circuit board is relatively low, and there is a relatively high loss between wires, which may also cause a limited signal transmission rate.

Figure 2:
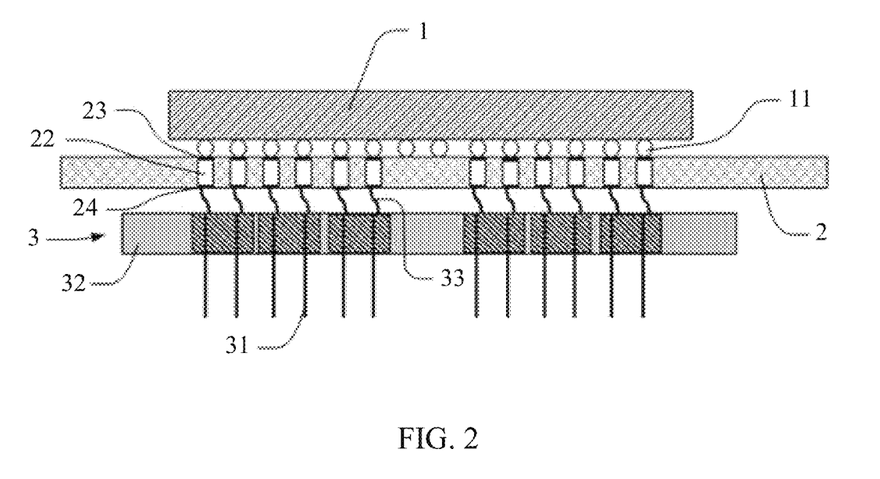
FIG. 2 is a schematic diagram of a structure of a signal transmission structure according to an embodiment of this disclosure.

Therefore, this disclosure provides an electronic device. The electronic device includes a signal transmission structure in which wiring does not need to be performed inside a circuit board or an extremely short wire inside the circuit board is required. FIG. 2 is a schematic diagram of a structure of a signal transmission structure according to an embodiment of this disclosure. As shown in FIG. 2, the signal transmission structure includes a chip 1, a circuit board 2 (PCB), and a cable assembly 3 (high-speed cable grid array (HSCGA)). The chip 1 is disposed on a surface on one side of the circuit board 2, and the chip 1 has a plurality of pins 11. The circuit board 2 has a plurality of conductive holes 22, and the pin 11 of the chip 1 is electrically connected to a side that is of the conductive hole 22 and that is close to the chip 1. The cable assembly 3 includes a cable 31. The cable assembly 3 is assembled on a surface on a side that is of the circuit board 2 and that is away from the chip 1. The cable 31 is electrically connected to a side that is of the conductive hole 22 and that is away from the chip 1, so that the cable 31 is electrically connected to the chip 1, and a signal of the chip I can be transmitted by using the cable 31. In this solution, the cable 31 is connected to the pin 11 of the chip 1 to transmit the signal of the chip 1. The conductive hole 22 can be disposed on the circuit board 2 to connect the chip 1 and the cable 31, and wires do not need to be disposed in a large area inside the circuit board 2. Wires do not need to be disposed in a large area inside the circuit board 2, so that a requirement for a loss-resistance property of a PCB material is relatively low, that is, a requirement for a level of the PCB material may be reduced, thereby reducing material costs. For example, when a same use requirement is met, the circuit board 2 in the conventional technology needs to be formed by pressing 32 layers of sub-boards, where a thickness of the circuit board is about 4 millimeters (mm). However, when the technical solution in this disclosure is used, the circuit board 2 needs to be formed by pressing only 16 layers of sub-boards, where a thickness of the circuit board is about 2.5 mm. Therefore, when the technical solution provided in this disclosure is used, costs of the circuit board are reduced by about 50%. In addition, a signal transmission rate of the cable 31 is much higher than a signal transmission rate of the wire inside the circuit board 2. Further, in an application scenario of high-speed signal transmission, a transmission loss of the cable is only 25% of a loss of the wire inside the PCB. To be specific, when the chip 1 has a same driving capability and there is no driver gain compensation, in a same link length, a transmission rate that can be supported by the cable is about four times of a transmission rate of the wire inside the PCB. In addition, at a same transmission rate, a transmission distance of the cable is at least four times of a transmission distance of the wire inside the PCB. Therefore, in this solution, not only costs of a product are reduced, but also an application range of a communications device is extended and high-speed performance of the product is improved.

It should be noted that in the embodiments of this disclosure, "electrical connection" means that two structures may be conductive or a signal may be transmitted between the two structures. However, two electrically connected structures may not be directly physically connected, that is, there may be another conductive structure such as a conductive hole, a conducting wire, or a pad between the two electrically connected structures. This is not limited in this disclosure.

Figure 3:
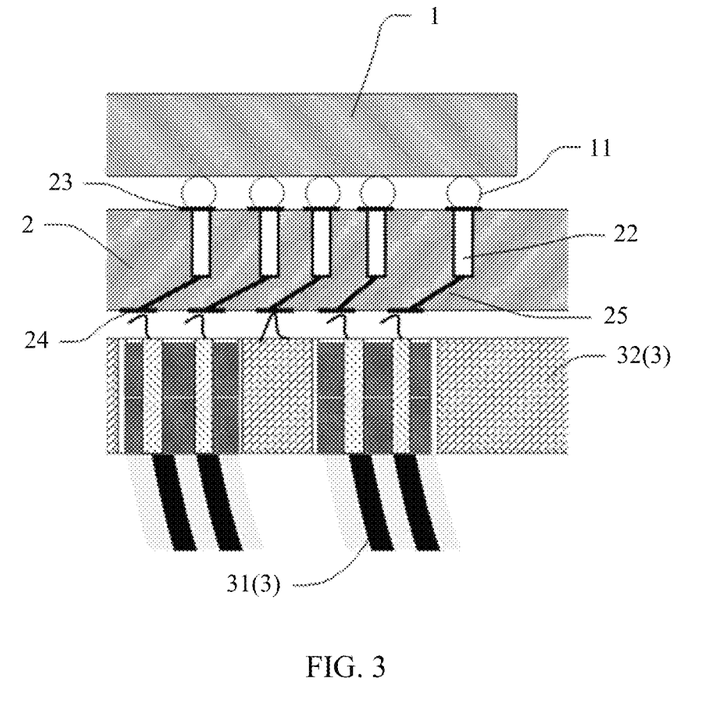
FIG. 3 is a partial enlarged view of a signal transmission structure according to an embodiment of this disclosure.

When the technical solution of this disclosure is further implemented, there may be a first pad 23 on a side that is of the circuit board 2 and that faces the chip 1, and there may be a second pad 24 on a side that is of the circuit board 2 and that faces the cable assembly 3. The first pad 23 and the second pad 24 of the circuit board 2 are electrically connected by using the conductive hole 22. When the first pad 23 is electrically connected to the second pad 24, the first pad 23 may be directly electrically connected to one end of the conductive hole 22, and the second pad 24 is directly connected to the other end of the conductive hole 22. In addition, FIG. 3 is a partial enlarged view of a signal transmission structure according to an embodiment of this disclosure. As shown in FIG. 3, a relatively short wire 25 may be further disposed inside the circuit board 2. The wire 25 is electrically connected to the conductive hole 22, and the first pad 23 or the second pad 24 is electrically connected to the wire 25. To be specific, in one implementation solution, the first pad 23 is electrically connected to one end of the conductive hole 22, and the second pad 24 is connected to the other end of the conductive hole 22 by using the wire 25. Further, one end of the wire 25 is electrically connected to the other end of the conductive hole 22, and the other end of the wire 25 is electrically connected to the second pad 24. In another implementation solution, the second pad 24 is electrically connected to the other end of the conductive hole 22, and the first pad 23 is connected to one end of the conductive hole 22 by using the wire 25. Further, one end of the wire 25 is connected to the first pad 23, and the other end of the wire 25 is connected to one end of the conductive hole 22. The relatively short wire 25 is disposed inside the circuit board 2, so that the conductive hole 22 can be arranged appropriately based on a requirement to improve flexibility of arrangement of the conductive hole 22, thereby reducing limitations on arrangement of the conductive hole 22 by the pin 11 in the chip 1, and improving flexibility of arrangement of the cable 31 in the cable assembly 3. The conductive hole 22 may be an electroplated hole. The pin 11 of the chip 1 is connected to the first pad 23, and the cable 31 is connected to the second pad 24. The conductive hole 22 may transmit a signal of the first pad 23 to the second pad 24, to transmit a signal of the chip 1 to the cable 31.

A manner of connecting the chip 1 and the circuit board 2 is not limited. The pin 11 of the chip I may be an elastic pin, and the chip 1 is connected to the first pad 23 by using the elastic pin. Alternatively, the pin 11 of the chip 1 may be a solder ball, and the chip 1 is welded to the first pad 23 by using the solder ball, that is, solder ball array (or BGA) package. In another aspect, the pins 11 of the chip 1 may be arranged in a land grid array (LGA). Correspondingly, the first pads 23 are also arranged in a land grid array. Any connection manner is applicable to this solution.

Figure 4:
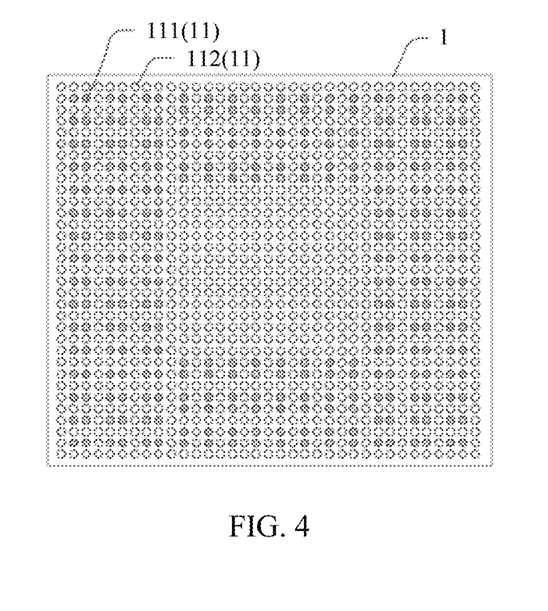
FIG. 4 is a schematic diagram of a structure of a side that is of a chip and that faces a circuit board according to an embodiment of this disclosure.

FIG. 4 is a schematic diagram of a structure of a side that is of a chip and that faces a circuit board according to an embodiment of this disclosure. In the embodiment shown in FIG. 4, a chip 1 with a size of 36 mm*36 mm is used as an example. The chip 1 includes a plurality of pins 11. The plurality of pins 11 are arranged in a 35*35 array, that is, the chip 1 has 1225 pins 11. A pitch between two adjacent pins 11 is 1.0 mm. The pins 11 include a signal pin 111 and a ground pin 112. The signal pin 111 is usually configured to transmit a high-speed differential signal (and naturally may also be configured to transmit another type of signal), and the ground pin 112 is configured to be grounded. The ground pin 112 is distributed around the signal pin 111, to shield a signal transmitted on another signal pin to prevent crosstalk caused to a signal transmitted on a protected signal pin 111. The pin 11 is electrically connected to the first pad 23 of the circuit board 2, and is transmitted to the second pad 24 by using the conductive hole 22, so that a high-speed signal is transmitted to the cable 31 and the ground pin 112 is grounded.

Figure 5:
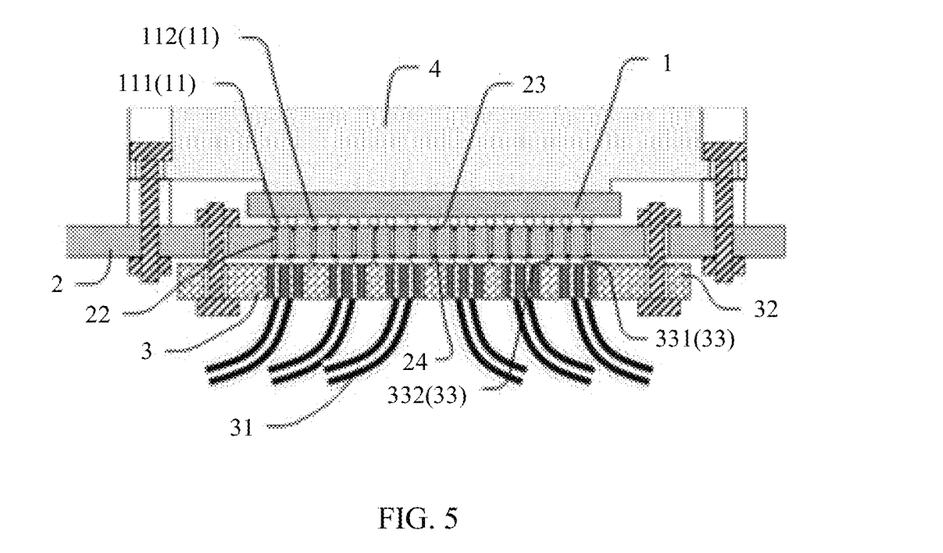
FIG. 5 is a schematic diagram of another structure of a signal transmission structure according to an embodiment of this disclosure.

FIG. 5 is a schematic diagram of another structure of a signal transmission structure according to an embodiment of this disclosure. In the embodiment shown in FIG. 5, the signal transmission structure includes a heat dissipation component 4, a chip 1, a circuit board 2, and a cable assembly 3. The chip 1 is fastened on a surface on one side of the circuit board 2, the cable assembly 3 is fastened on a surface on a side that is of the circuit board 2 and that is away from the chip 1, and the heat dissipation component 4 is fastened on a surface on a side that is of the chip 1 and that is away from the circuit board 2. There are respectively a first pad 23 and a second pad 24 on two side surfaces of the circuit board 2, and a conductive hole 22 is connected between the first pad 23 and the second pad 24, so that the first pad 23 is electrically connected to the second pad 24. There is a plurality of pins 11 on a side that is of the chip 1 and that faces the circuit board 2, and the chip 1 is connected to the first pad 23 of the circuit board 2 by using the pin 11, to implement fixed connection and electrical connection between the chip 1 and the circuit board 2. The pins 11 of the chip 1 include a signal pin 111 and a ground pin 112. The cable assembly includes a base 32, a cable 31, and a connection terminal 33. The connection terminal 33 includes a signal connection terminal 331 and a ground connection terminal 332. The base 32 is fastened to the circuit board 2, and the cable 31 is fastened to the base 32, so that the cable 31 and the circuit board 2 are relatively fastened, to improve reliable transmission of an electrical signal from the chip 1 to the cable 31. The signal connection terminal 331 is connected to the second pad 24 and is then connected to the first pad 23 by using the conductive hole 22, to be connected to the signal pin 111 of the chip 1. One end of the signal connection terminal 331 of the cable assembly 3 is electrically connected to the signal pin 111 of the chip 1, and the other end of the signal connection terminal 331 is electrically connected to the cable 31, to transmit a signal of the chip 1 by using the cable 31. Similarly, the ground connection terminal 332 is connected to the second pad 24 and is connected to the first pad 23 by using the conductive hole 22, to be connected to the ground pin 112 of the chip 1. One end of the ground connection terminal 332 of the cable assembly 3 is electrically connected to the ground pin 112 of the chip 1, and the other end of the ground connection terminal 332 is electrically connected to the cable 31, that is, the ground connection terminal 332 is grounded by using the cable 31. The heat dissipation component 4 is fastened on the side that is of the chip 1 and that is away from the circuit board 2. Further, the heat dissipation component 4 may be attached to the surface that is of the chip 1 and that is away from the circuit board 2. To install the heat dissipation component 4, the heat dissipation component 4 may be fastened to the circuit board 2 by using a thread, so that a connection structure is relatively reliable and is easy for installation and removal.

The base 32 of the cable assembly 3 is fixedly connected to the circuit board 2, and a specific fastening manner is not limited. In one implementation, the base 32 may be bonded to the circuit board 2, and a structure is relatively simple. In another implementation, the base 32 may be welded to the circuit board 2, and connection strength is relatively high. In still another implementation, the base 32 may be fixedly installed on the circuit board 2 by using a thread. In this solution, a threaded connection structure is relatively reliable and is a detachable connection, which helps maintain the signal transmission structure. Alternatively, in another embodiment, the base 32 may be crimped or riveted to the circuit board 2. This is not limited in this disclosure.

Figure 6:
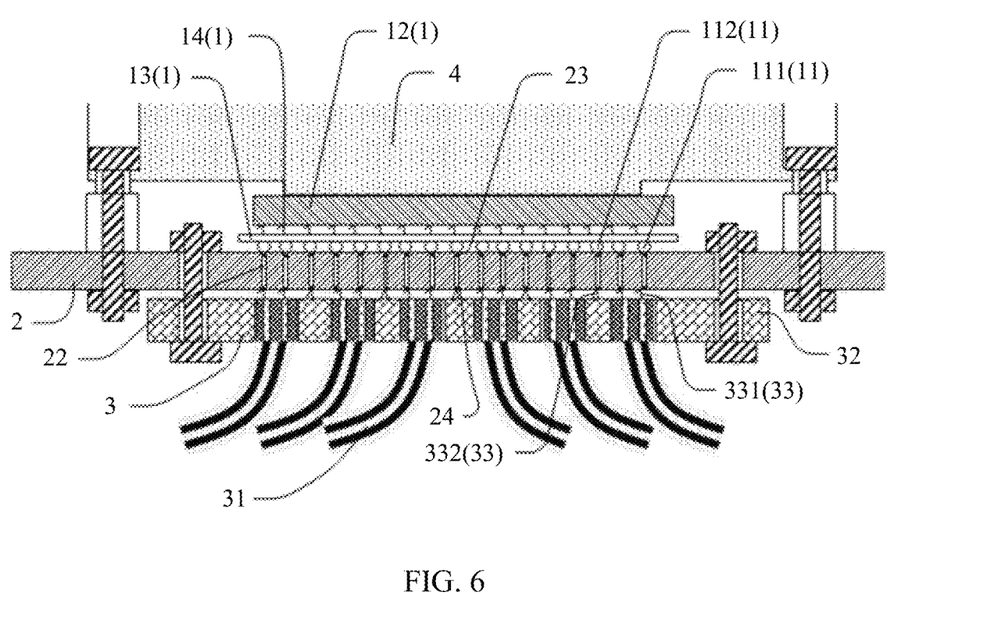
FIG. 6 is a schematic diagram of another structure of a signal transmission structure according to an embodiment of this disclosure.

FIG. 6 is a schematic diagram of another structure of a signal transmission structure according to an embodiment of this disclosure. In the embodiment shown in FIG. 6, the chip 1 is a separate chip, and the separate chip includes a chip body 12 and an installation base 13. There is an elastic pin 14 on a side that is of the installation base 13 and that faces the chip body 12, and the elastic pin 14 is electrically connected to a pin of the chip body 12. On a side that is of the installation base 13 and that is away from the chip body 12, there is a pin 11 electrically connected to the elastic pin 14, and the pin 11 of the installation base 13 is electrically connected to the first pad 23 of the circuit board 2.

Figure 7:
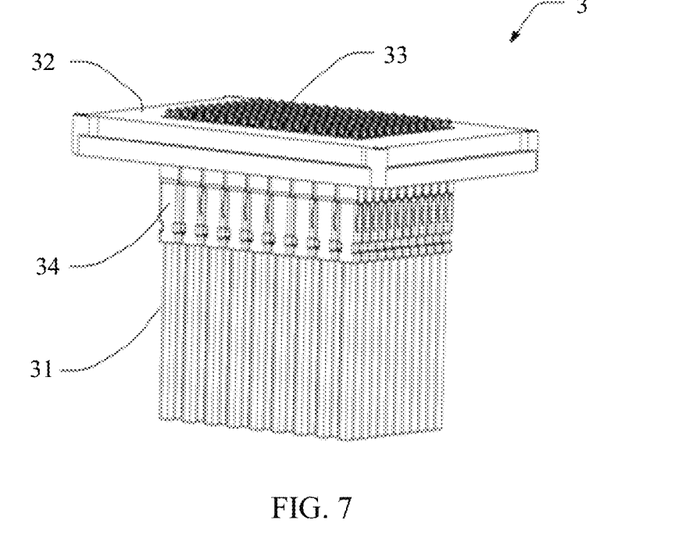
FIG. 7 is a schematic diagram of a structure of a cable assembly according to an embodiment of this disclosure.
Figure 8:
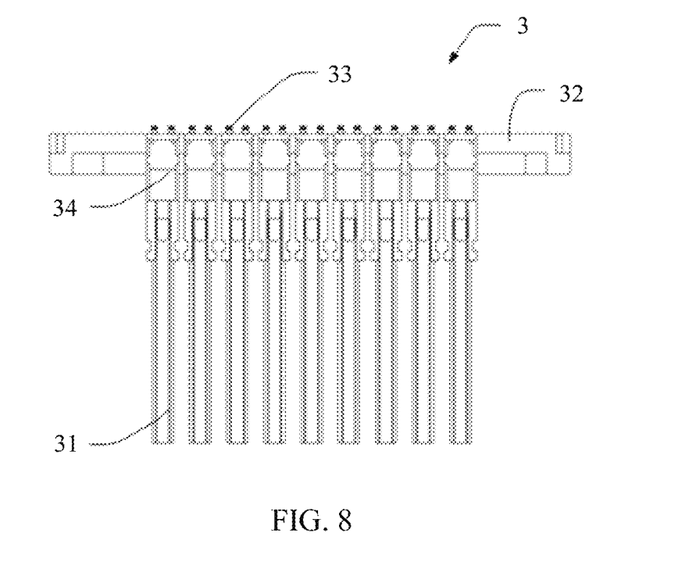
FIG. 8 is a schematic diagram of a side structure of a cable assembly according to an embodiment of this disclosure.

FIG. 7 is a schematic diagram of a structure of a cable assembly according to an embodiment of this disclosure. FIG. 8 is a schematic diagram of a side structure of a cable assembly according to an embodiment of this disclosure. As shown in FIG. 7 and FIG. 8, the cable assembly 3 includes a base 32, a cable 31, and a connection terminal 33. The connection terminal 33 includes a signal connection terminal 331 and a ground connection terminal 332. The connection terminal 33 is disposed on a surface on one side of the base 32, the cable 31 is located on a surface on a side that is of the base 32 and that is away from the connection terminal 33, and the cable 31 is fastened to the base 32 and connected to the connection terminal 33 (the signal connection terminal 331 or the ground connection terminal 332) in a one-to-one correspondence manner. Ends that are of a plurality of connection terminals 33 and that are away from the base 32 are almost located on a same plane. A surface formed by end surfaces of the ends that are of the plurality of connection terminals 33 and that are away from the base 32 has flatness less than or equal to 0.2 mm, and elastic deformation of the connection terminal 33 can be greater than or equal to the flatness. Further, the flatness is a deviation of a concave/convex height of a plane from an ideal plane, and the concave/convex height is a height perpendicular to a direction of the ideal plane. Therefore, when the base 32 of the cable assembly 3 is fastened to the circuit board 2, all the connection terminals 33 can be connected to the second pad 24 of the circuit board 2, thereby improving reliability of electrical connection, and ensuring that a signal can be effectively transmitted. To ensure an elastic deformation capability of the connection terminal 33, a beryllium copper elastic pin may be selected. The connection terminal 33 may have a sheet-shaped structure, and a thickness of the connection terminal with the sheet-shaped structure should be relatively small, and may be 0.05 mm to 0.1 mm. In a specific embodiment, the thickness of the metal terminal may be 0.05 mm, an elastic deformation amount is 0.3 mm, and maximum elastic deformation pressure is less than 40 grams (g)/pin.

Figure 9:
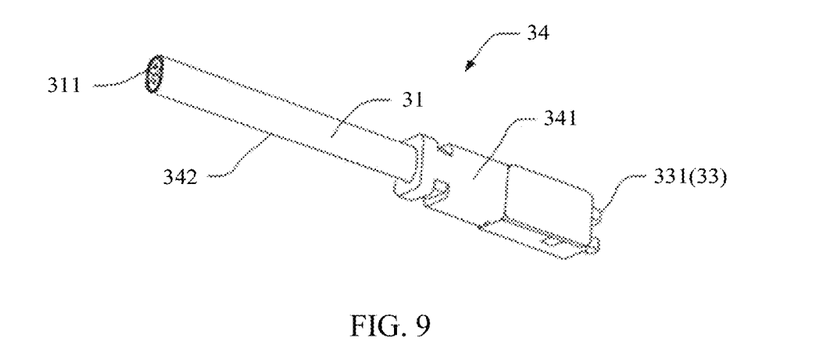
FIG. 9 is a schematic diagram of a structure of a cable unit according to an embodiment of this disclosure.
Figure 10:
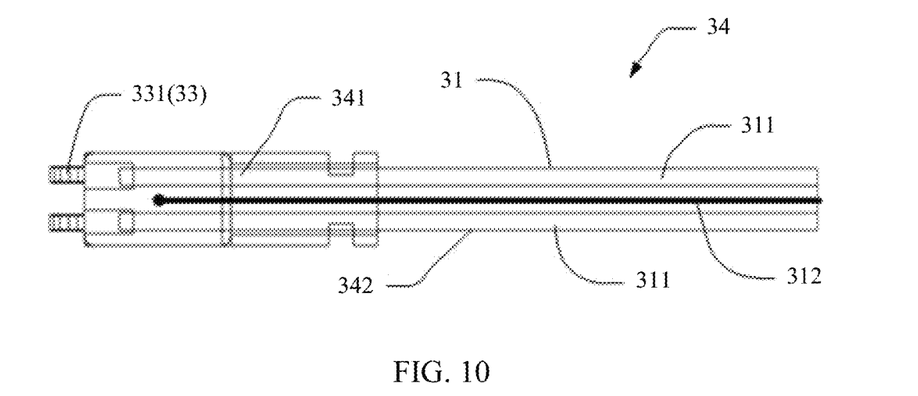
FIG. 10 is a schematic diagram of a side structure of a cable unit according to an embodiment of this disclosure.

As shown in FIG. 7 and FIG. 8, the cable assembly 3 in this embodiment of this disclosure may include a cable unit 34. A quantity of cable units 34 included in each cable assembly 3 is not limited, and there may be one, two, or more cable units 34. FIG. 9 is a schematic diagram of a structure of a cable unit according to an embodiment of this disclosure. FIG. 10 is a schematic diagram of a side structure of a cable unit according to an embodiment of this disclosure. As shown in FIG. 9 and FIG. 10, the cable unit 34 includes a cable 31, a connection terminal 33, and a cable fastening head 341. The cable 31 includes at least two signal wires 311, and the connection terminal 33 includes a signal connection terminal 331. The cable fastening head 341 is at a location at which the signal cable 31 is connected to the signal connection terminal 331, and the signal connection terminal 331 is exposed from the cable fastening head 341, to be connected to a pad of the circuit board 2. There is a wrapping layer 342 outside the cable 31. In one aspect, the cable fastening head 341 improves reliability of connection between the signal connection terminal 331 and the signal cable 31. In another aspect, the cable fastening head 341 is configured to fasten or install the cable unit 34 on the base 32 of the cable assembly 3. A specific manner of fastening the cable unit 34 on the base 32 is not limited. The cable fastening head 341 may be clamped to the base 32, to facilitate installation and replacement of the cable unit 34, so that flexibility is relatively high. Alternatively, the cable fastening head 341 and the base 32 may be molded together, so that a connection structure is relatively reliable.

The cable 31 includes at least two signal wires 311. In an embodiment, the cable 31 includes two signal wires 311, and the two signal wires 311 are connected to a pair of differential signal pins of the chip 1. When the cable 31 is merely configured to transmit a differential signal, because each pair of differential signals includes two differential signals, a quantity of signal wires 311 included in the cable 31 is an even number. When the cable 31 is applied, the signal wire 311 of the cable 31 may be further configured to transmit another signal. In this scenario, a quantity of signal wires 311 included in the cable may be an even number or an odd number.

In the cable assembly 3, when the cable fastening head 341 is installed on the base 32, the cable fastening head 341 may or may not be disposed perpendicular to the base 32. The cable fastening head 341 and the base 32 may be disposed to form a specified angle, that is, the cable fastening head 341 is disposed inclined to the base 32. An appropriate disposing angle may be selected based on an actual product installation requirement.

Figure 11:
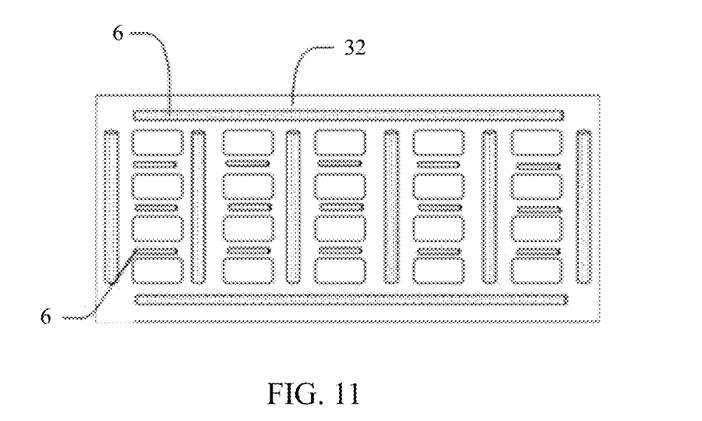
FIG. 11 is a schematic diagram of a structure of a surface of a base of a cable assembly according to an embodiment of this disclosure.

FIG. 11 is a schematic diagram of a structure of a surface of a base according to an embodiment of this disclosure. As shown in FIG. 11, in the technical solution of this disclosure, a surface of the base 32 has one or more conductive parts 6, and the conductive part 6 is configured to be grounded. As shown in FIG. 10, the cable 31 may further include a grounding part, and the grounding part is electrically connected to the conductive part 6 by using another conductor. The grounding part may provide a reference voltage for a signal of the signal wire 311 of the cable 31.

Further, the grounding part may be a grounding wire 312, and the grounding wire 312 is disposed in parallel with the signal wire 311. The grounding wire 312 is electrically connected to the conductive part 6 of the base 32, to ground the cable. Further, a conductive structure may be disposed on the cable fastening head 341, and the grounding wire 312 is electrically connected to the conductive structure of the cable fastening head 341. After the cable fastening head 341 is installed on the base 32, the conductive structure of the cable fastening head 341 is electrically connected to the conductive part 6 of the base 32, to ground the grounding wire 312 of the cable. In another technical solution, the wrapping layer 342 includes a shielding layer and a protection layer. In this case, the shielding layer may be used as the grounding part of the cable 31 to be electrically connected to the conductive part 6 of the base 32, to ground the cable. Further, the shielding layer may be electrically connected to the conductive structure of the cable fastening head 341. After the cable fastening head 341 is installed on the base 32, the conductive structure of the cable fastening head 341 is electrically connected to the conductive part 6 of the base 32, to ground the grounding wire 312 of the cable.

The connection terminal 33 of the cable assembly 3 may be an elastic pin, a spring pin, a solder ball, or a crimping pin. This is not limited in this disclosure and is selected based on a product requirement.

The cable unit 34 includes two signal wires 311, and each cable unit 34 is configured to transmit a pair of differential signals in the chip 1, that is, each signal wire 311 is connected to transmit a differential signal in the pair of differential signals. A location of the cable unit 34 in the cable assembly 3 may be arranged based on differential signal distribution in the chip 1, and therefore, flexibility of this solution is relatively high.

In the technical solution of this disclosure, arrangement density of a plurality of cable units 34 on the base 32 matches arrangement density of signal pins 111 of the chip 1. Because the arrangement density of the signal pins 111 of the chip 1 is relatively high, in this solution, the arrangement density of the plurality of cable units 34 on the base is relatively high, that is, a pitch between adjacent cable units 34 is relatively short. According to the technical solution of this disclosure, the grounding part of the cable 31 does not occupy space of the cable fastening head of the cable unit 34, so that a size that is of the cable unit 34 and that protrudes from the base 32 at a location at which the cable unit 34 is connected to the base 32 can be reduced, thereby helping improve the arrangement density of the plurality of cable units 34 on the base 32. It should be noted that, that the arrangement density of the plurality of cable units 34 on the base 32 matches the arrangement density of the signal pins 111 of the chip 1, may mean that the arrangement density of the plurality of cable units 34 on the base 32 is equal to or slightly different from the arrangement density of the signal pins 111 of the chip 1. Therefore, it may be considered that the arrangement density of the plurality of cable units 34 on the base 32 is almost the same as the arrangement density of the signal pins 111 of the chip 1.

Figure 12:
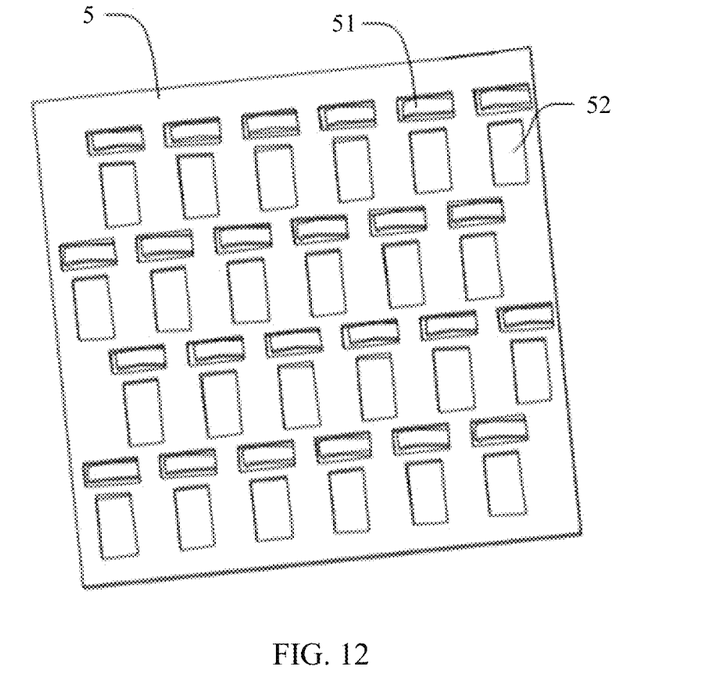
FIG. 12 is a schematic diagram of a structure of a conductive part according to an embodiment of this disclosure.

To ground the ground pin 112 of the chip 1 and shield an interference signal, the ground pin 112 of the chip 1 may be electrically connected to the conductive part 6 of the base (refer to FIG. 12). In this solution, the ground pin 112 of the chip 1 and the base 32 of the cable assembly 3 form a common ground network design. Further, grounding may be implemented by using the surface of the base 32 of the cable assembly 3, and a structure is relatively simple, which may simplify a manufacturing process.

In specific implementation, the ground pin 112 of the chip 1 may be electrically connected to the conductive part 6 by using the conductive hole 22 of the circuit board 2. The connection terminal 33 of the cable assembly 3 further includes the ground connection terminal 332, and the ground connection terminal 332 connects the ground pin 112 and the conductive part 6. Further, one end of the ground connection terminal 332 is electrically connected to the conductive part 6, and the other end of the ground connection terminal 332 is electrically connected to the second pad 24. The second pad 24 is connected to the first pad 23 by using the conductive hole 22 and is further electrically connected to the ground pin 112 of the chip 1, to implement a common ground network design for the ground pin 112 of the chip 1 and the base 32 of the cable assembly 3. In a specific implementation process, the ground connection terminal 332 may have a structure the same as that of the signal connection terminal 331, and the ground connection terminal 332 is fastened to the base 32. An end that is of the ground connection terminal 332 and that faces the circuit board 2 and an end that is of the signal connection terminal 331 and that faces the circuit board 2 are located on a same plane.

A specific structure of the conductive part 6 on the surface of the base 32 is not limited. In an embodiment, the base 32 may be a metal base 32, and the conductive part 6 is at least a part of a region of the base 32. In this case, if the conductive structure of the cable fastening head 341 is electrically connected to the conductive part 6, when the cable fastening head 341 is installed on the base 32, the conductive structure of the cable fastening head 341 may be in contact with the base 32, to be connected to the conductive part 6 by using conductivity of the base 32. In this solution, the conductive structure of the cable fastening head 341 and the base 32 are other conductors. Optionally, the base 32 is insulated, and an independent conductive part 6 may be manufactured on a surface of a body of the insulation base 32, for example, a metal layer is coated on an outer surface of a plastic body or a conductive part is fastened on the plastic body. Therefore, a conductive layer may be coated on an inner wall of an opening at which the cable fastening head 341 is installed on the base 23, the conductive layer is in contact with and electrically connected to the conductive structure of the cable fastening head 341, and then the conductive layer is electrically connected to the conductive part 6 of the base. In this solution, the conductive structure of the cable fastening head 341 and the conductive layer are other conductors. When the base 32 is insulated, the conductive part 6 is electrically connected to the grounding part of the cable unit 34 by using another conductor. Certainly, a specific material of the base 32 is not limited. However, the base 32 needs to provide enough strength support for the cable assembly 3, and further needs to provide enough flatness, so that a plane at an end that is of the connection terminal 33 in the cable assembly 3 and that faces the chip 1 has relatively high flatness. In addition, a product form of the base is usually a board.

FIG. 11 is a schematic diagram of a structure of a conductive part according to an embodiment of this disclosure. As shown in FIG. 11, in another specific technical solution, the conductive part 6 may be a metal plate 5, and the metal plate 5 is fastened on a side that is of the base 32 of the cable assembly 3 and that faces the circuit board 2. The metal plate 5 has a compressible contact 51 and an opening 52. The compressible contact 51 is electrically connected to the second pad 24. Further, the compressible contact 51 may be in contact with the second pad 24. The second pad 24 is electrically connected to the ground pin 112 of the chip 1, so that the ground pin 112 of the chip 1 and the base 32 of the cable assembly 3 form a common ground network. The opening 52 is configured to enable the basic cable unit to pass through the base 32, and enable the signal connection terminal 331 of the basic cable unit to be electrically connected to the second pad 24. In a specific embodiment, the compressible contact 51 may be a stamping convex hull or may be an elastic connection adhesive. This is not limited in this disclosure.

In another technical solution, as shown in FIG. 10, the conductive part 6 is bonded to the side that is of the base 32 of the cable assembly 3 and that faces the circuit board 2. Further, the conductive part 6 includes a conductive foam, a conductive adhesive, or a shielding conductive pad. The conductive part 6 is elastic, so that when the base 32 and the circuit board 2 are fixedly installed, the conductive part 6 may be directly electrically connected to the conductive hole 22, and a structure is relatively simple. Further, the conductive part 6 is electrically connected to the second pad 24, and the second pad 24 is electrically connected to the ground pin 112 of the chip 1, so that the ground pin 112 of the chip 1 and the base 32 of the cable assembly 3 form a common ground network.

Figure 13:
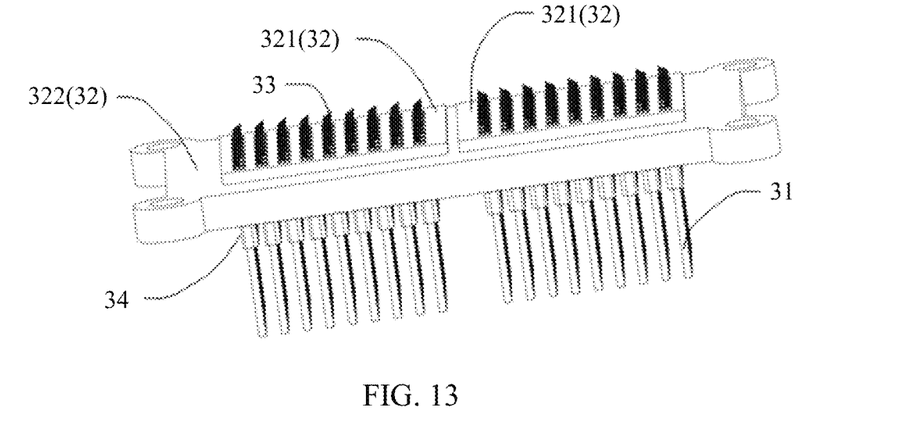
FIG. 13 is a schematic diagram of another structure of a cable assembly according to an embodiment of this disclosure.
Figure 15:
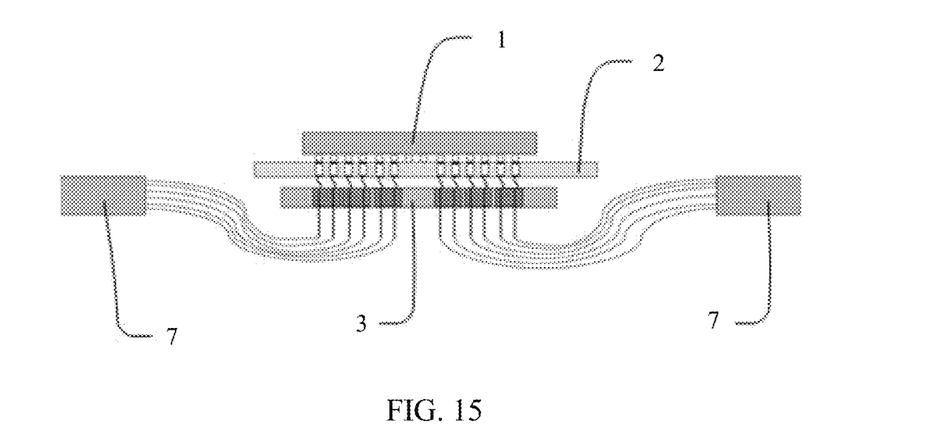
FIG. 15 is a schematic diagram of another application of a signal transmission structure according to an embodiment of this disclosure.

In a specific technical solution, a specific structure of the base 32 is not limited. Generally, a form of the base 32 is a board-shaped base 32. As shown in FIG. 7, the base is an entire structure. FIG. 13 is a schematic diagram of another structure of a cable assembly according to an embodiment of this disclosure. Referring to FIG. 15, in another technical solution, the base 32 includes at least two splicing parts 321, and the cable unit 34 is fastened to the splicing parts 321. The splicing parts 321 are spliced to form a complete base 32. A specific manner of splicing the splicing parts 321 is not limited. As shown in FIG. 15, the base 32 includes a fastening part 322, and the splicing parts 321 are spliced by using the fastening part 322 to form the complete base 32. Alternatively, the splicing parts 321 may be fastened by using a screw or may be bonded.

Figure 14:
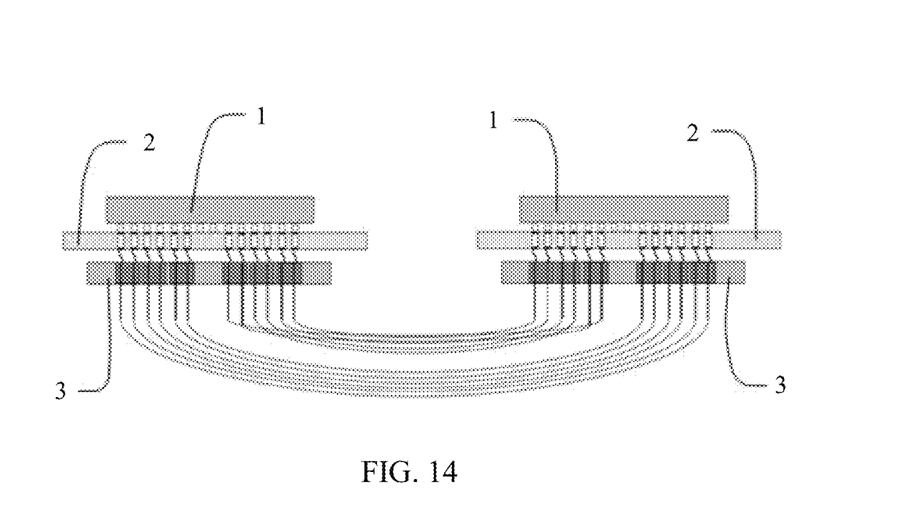
FIG. 14 is a schematic diagram of an application of a signal transmission structure according to an embodiment of this disclosure.

In the technical solution of this disclosure, an end that is of the cable 31 of the cable assembly 3 and that is away from the chip 1 may be connected to various structures based on a requirement. For example, in an embodiment, the end that is of the cable 31 of the cable assembly 3 and that is away from the chip 1 may be electrically connected to the chip 1. As shown in FIG. 14, the other end of the cable 31 of the cable assembly 3 also has a cable assembly 3, which is electrically connected to another chip 1. In other words, the two cable assemblies 3 share one cable 31, to implement communication between the two chips 1. In this solution, the two ends of the cable 31 of the cable assembly 3 may be connected to a same terminal. Alternatively, as shown in FIG. 15, the end that is of the cable 31 of the cable assembly 3 and that is away from the chip 1 may be connected to a connector, to perform signal transmission with another structure. A specific type of the connector is not limited. For example, the connector may be an external connector or may be a backplane connector. Further, when the connector is an external connector, the connector may be a connector with an optical port, to transmit a signal from the chip 1 to an optical module. When the connector is a backplane connector, connection between backplanes can be implemented.

The foregoing descriptions are merely specific implementations of this disclosure, but are not intended to limit the protection scope of this disclosure. Any variation or replacement readily figured out by a person skilled in the art within the technical scope disclosed in this disclosure shall fall within the protection scope of this disclosure. Therefore, the protection scope of this disclosure shall be subject to the protection scope of the claims.

The invention claimed is:

1. A signal transmission structure comprising:
   a circuit board comprising:
      a plurality of conductive holes;
      a first side comprising a first surface; and
      a second side comprising a second surface;
   a chip assembled on the first surface and electrically coupled to each of the conductive holes, wherein the second side is away from the chip; and
   a cable assembly that is assembled on the second surface, that is configured to implement signal transmission with the chip, and that comprises:
      a plurality of cables that is electrically coupled to the conductive holes;
      a base comprising a third surface comprising one or more conductive parts configured to be grounded; and
      a plurality of cable units installed on the base, wherein each of the cable units comprises a grounding part electrically coupled to the one or more conductive parts, and
   wherein the chip further comprises a ground pin electrically coupled to the one or more conductive parts using a corresponding one of the conductive holes.

2. The signal transmission structure of claim 1, wherein the circuit board further comprises:
   a first pad electrically coupled to the chip and to a first end of a first conductive hole of the conductive holes; and
   a second pad electrically coupled to one of the cables and to a second end of the first conductive hole.

3. The signal transmission structure of claim 1, wherein each of the cable units further comprises:
   a signal connection terminal; and
   one of the cables electrically coupled to the signal connection terminal, and
   wherein the chip further comprises a signal pin electrically coupled to the signal connection terminal using the corresponding one of the conductive holes.

4. The signal transmission structure of claim 3, wherein a first arrangement density of the cable units on the base matches a second arrangement density of signal pins of the chip.

5. The signal transmission structure of claim 1, wherein the base is a metal base, and wherein the one or more conductive parts are at least a part of a region of the base.

6. The signal transmission structure of claim 1, wherein the base is an insulator, and wherein the one or more conductive parts are a metal plate that is fastened on the base and that comprises a compressible contact that is electrically coupled to the ground pin.

7. The signal transmission structure of claim 1, wherein each of the cable units further comprises a cable fastening head configured to fasten each of the cable units on the base.

8. A device comprising:
   a signal transmission structure comprising:
      a circuit board comprising:
         a plurality of conductive holes;
         a first side comprising a first surface; and
         a second side comprising a second surface;
      a chip assembled on the first surface and electrically coupled to each of the conductive holes, wherein the second side is away from the chip; and
      a cable assembly that is assembled on the second surface, that is configured to implement signal transmission with the chip, and that comprises:
         a plurality of cables that is electrically coupled to the conductive holes;
         a base comprising a third surface comprising one or more conductive parts configured to be grounded; and
         a plurality of cable units installed on the base, wherein each of the cable units comprises a grounding part electrically coupled to the one or more conductive parts, and
      wherein the chip further comprises a ground pin electrically coupled to the one or more conductive parts using a corresponding one of the conductive holes.

9. A cable assembly comprising:
a base comprising a first surface comprising one or more conductive parts configured to be grounded; and
a plurality of cable units installed on the base, wherein each of the cable units comprises:
   a cable; and
   a grounding part electrically coupled to the one or more conductive parts,
wherein the one or more conductive parts are configured to be electrically coupled to a ground pin of a chip through a conductive hole on a circuit board.

10. The cable assembly of claim 9, wherein the cable comprises at least two signal wires, and wherein each of the cable units further comprises:
   a signal connection terminal, wherein each of the at least two signal wires is coupled to the signal connection terminal in a one-to-one manner; and
   a cable fastening head fastened on the base and disposed at a location at which each of the at least two signal wires is coupled to the signal connection terminal.

11. The cable assembly of claim 9, wherein the cable units are configured to couple to a plurality of signal pins of the chip in a one-to-one manner using the conductive hole on the circuit board, and wherein a first arrangement density of the cable units matches a second arrangement density of the signal pins.

12. The cable assembly of claim 9, wherein the base is a metal base, and wherein the one or more conductive parts are at least a part of a region of the base.

13. The cable assembly of claim 9, wherein the base is an insulator, and wherein the one or more conductive parts are a metal plate that is fastened on the base and that comprises a compressible contact that is configured to be electrically coupled to the ground pin of the chip.

14. The cable assembly of claim 9, wherein the base comprises at least two splicing parts.

15. The cable assembly of claim 9, wherein the base is an insulator, and wherein the one or more conductive parts are fastened on the first surface.

16. The signal transmission structure of claim 1, wherein the circuit board further comprises:
   a first pad electrically coupled to the chip and a corresponding one of the conductive holes;
   a second pad electrically coupled to one of the cables; and
   a wire located inside the circuit board, coupled to the corresponding one of the conductive holes, and electrically coupled to the second pad.

17. The signal transmission structure of claim 1, wherein the circuit board further comprises:
   a first pad electrically coupled to the chip;
   a second pad electrically coupled to one of the cables and a corresponding one of the conductive holes; and
   a wire located inside the circuit board, coupled to the corresponding one of the conductive holes, and electrically coupled to the first pad.

18. The signal transmission structure of claim 1, wherein the base is an insulator, and wherein the one or more conductive parts are fastened on the third surface.

19. The device of claim 8, wherein the circuit board further comprises:
   a first pad electrically coupled to the chip and to a first end of a first conductive hole of the conductive holes; and
   a second pad electrically coupled to one of the cables and to a second end of the first conductive hole.

20. The device of claim 8, wherein each of the cable units further comprises:
   a signal connection terminal; and
   one of the cables electrically coupled to the signal connection terminal, and
   wherein the chip further comprises a signal pin electrically coupled to the signal connection terminal using the corresponding one of the conductive holes.

\* \* \* \* \*